United States Patent
Chang

(10) Patent No.: US 8,237,063 B2
(45) Date of Patent: Aug. 7, 2012

(54) SHIELDING ASSEMBLY WITH REMOVABLE SHIELDING COVER

(75) Inventor: Chih-Kai Chang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 278 days.

(21) Appl. No.: 12/764,105

(22) Filed: Apr. 21, 2010

(65) Prior Publication Data

US 2011/0214916 A1    Sep. 8, 2011

(30) Foreign Application Priority Data

Mar. 8, 2010  (CN) .................... 2010 2 0125362.0

(51) Int. Cl.
*H05K 9/00* (2006.01)
(52) U.S. Cl. .................... 174/382; 174/384; 361/816
(58) Field of Classification Search .................. 174/382, 174/384; 361/816
See application file for complete search history.

(56) References Cited

U.S. PATENT DOCUMENTS

| | | | |
|---|---|---|---|
| 7,501,587 B2 * | 3/2009 | English | 174/354 |
| 7,504,592 B1 * | 3/2009 | Crotty, Jr. | 174/372 |
| 7,772,505 B2 * | 8/2010 | Poulsen | 174/382 |
| 7,903,431 B2 * | 3/2011 | English et al. | 361/816 |
| 7,926,166 B2 * | 4/2011 | Zuehlsdorf et al. | 29/602.1 |
| 7,928,325 B2 * | 4/2011 | Tsai et al. | 174/382 |
| 8,081,476 B2 * | 12/2011 | Tsao et al. | 361/719 |
| 2002/0139552 A1 * | 10/2002 | Chang | 174/35 R |
| 2003/0062179 A1 * | 4/2003 | West | 174/35 R |
| 2007/0235221 A1 * | 10/2007 | Chang | 174/382 |
| 2008/0000683 A1 * | 1/2008 | Vinokor et al. | 174/382 |
| 2009/0178841 A1 * | 7/2009 | Lei | 174/382 |
| 2009/0242264 A1 * | 10/2009 | Lei | 174/382 |

\* cited by examiner

*Primary Examiner* — Hung Ngo

(74) *Attorney, Agent, or Firm* — Altis Law Group, Inc.

(57) ABSTRACT

A shielding assembly includes a hollow frame and a cover mounted to the hollow frame. The hollow frame comprises a plurality of sidewalls, where one of the sidewalls defines a first groove and another one of the sidewall opposite to the one of sidewalls includes a first fixing portion. The cover includes a first end, a second end opposite to the first end, a first latch located on the first end and engaged with the first groove, and a second fixing portion located on the second end and engaged with the first fixing portion, so as to retain the cover on the frame. The first latch includes a resilient bent portion extending from the first end of the cover, and a hook protruding from the resilient bent portion and received in the groove.

7 Claims, 5 Drawing Sheets

SHIELDING ASSEMBLY WITH REMOVABLE SHIELDING COVER

BACKGROUND

1. Technical Field

The disclosure generally relates to shielding assemblies.

2. Description of Related Art

In order to protect electronic components on a circuit board of an electronic device from electromagnetic interference (EMI), shielding assemblies are generally employed to cover the electronic components. A commonly used shielding assembly is made by punching a metal piece and soldering the punched metal piece to the circuit board. With this structure, to repair the electronic components, the shield must be disassembled from the circuit board with special tools, which is inconvenient and may become damaged and deformed and becomes unusable in the disassembly process the shield.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
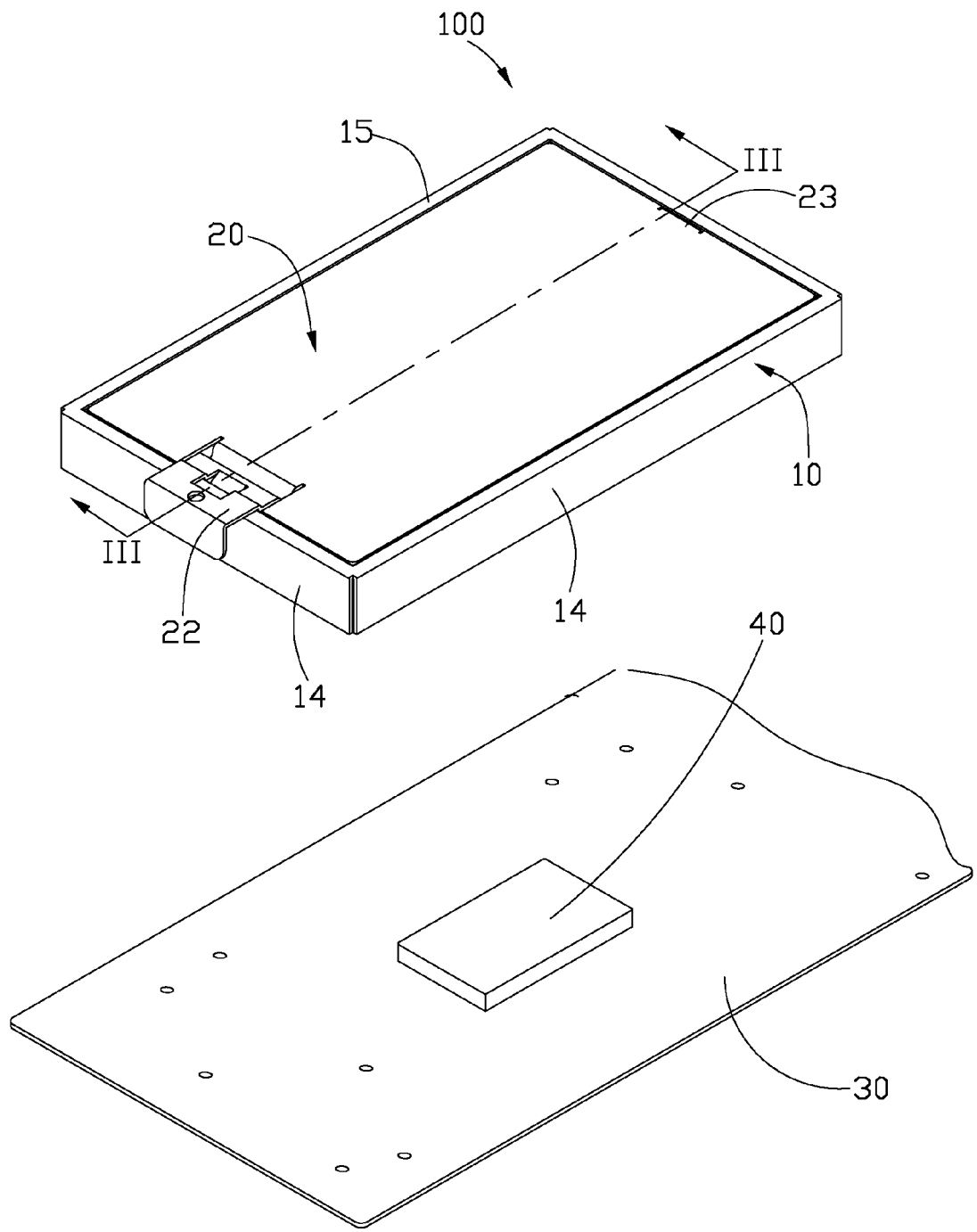
FIG. 1 is a perspective, isometric view of a shielding assembly in accordance with a first embodiment of the disclosure, in which the shielding assembly is mounted to a circuit board to provide protection against electromagnetic interference for an electronic component.
Figure 2:
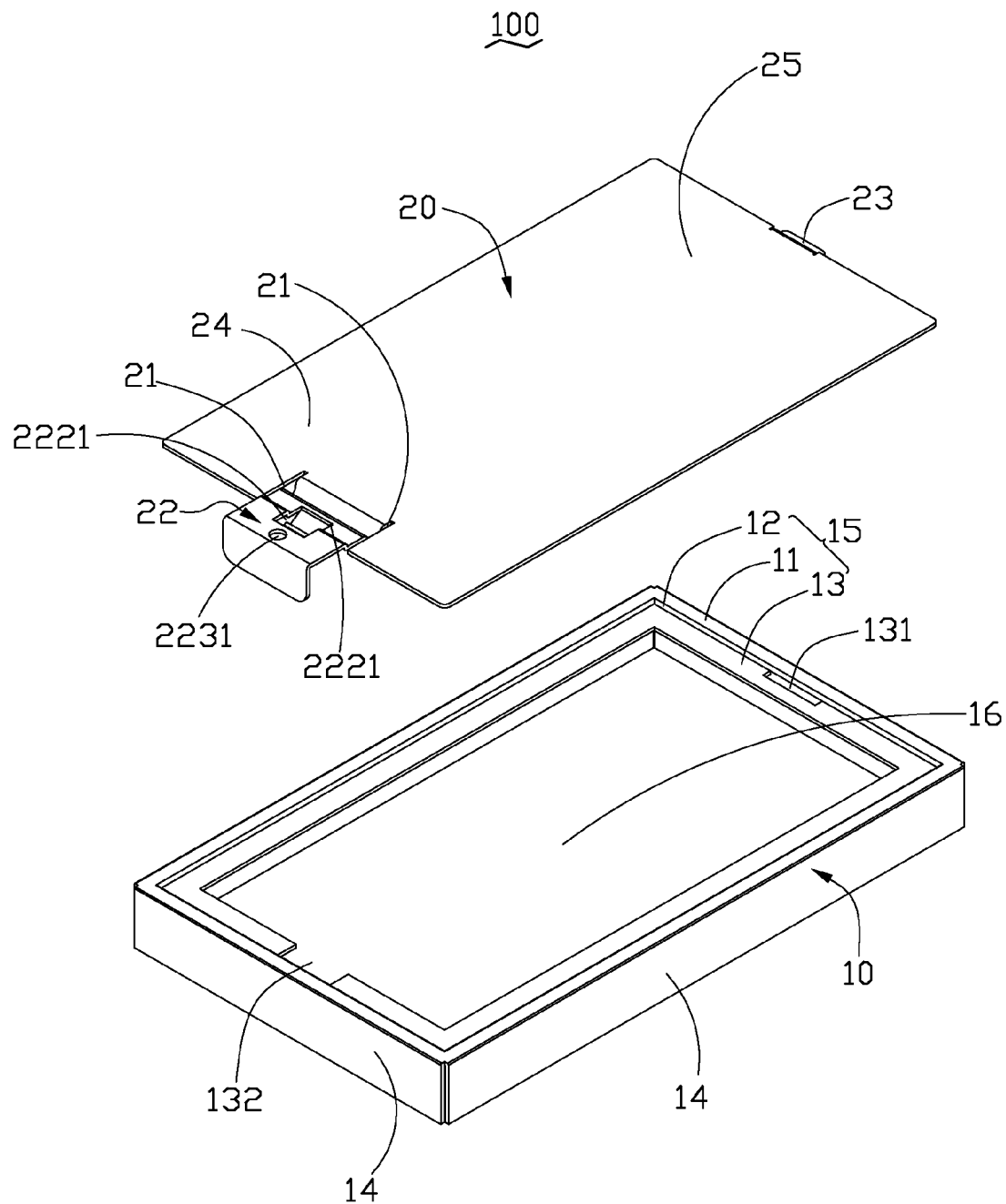
FIG. 2 is an exploded perspective view of the shielding assembly of FIG. 1.

FIG. 1 is a perspective, isometric view of a shielding assembly 100 in accordance with a first embodiment of the disclosure. FIG. 2 is an exploded perspective view of the shielding assembly 100 of FIG. 1. The shielding assembly 100 is mounted to a circuit board 30 to protect an electronic component 40 positioned on the circuit board 30 against electromagnetic interference (EMI). The shielding assembly 100 comprises a hollow frame 10 and a cover 20 matched with the frame 10.

The hollow frame 10 comprises a plurality of sidewalls 14 and a plurality of top portions 15 respectively perpendicularly extending from the sidewalls 14, which collectively define a hollow area 16. Each top portion 15 comprises a top wall 11 extending from edge of the corresponding sidewall 14 and towards the hollow area 16 of the hollow frame 10. A resisting wall 12 extends perpendicularly from the top wall 11, and a supporting wall 13 extends perpendicularly from the resisting wall 12 and towards the hollow area 16 of the hollow frame 10. In the embodiment, the resisting walls 12 and the supporting walls 13 collectively define the hollow area 16.

The supporting wall 13 of one of the top portions 15 defines a first groove 132, and the supporting wall 13 of another one of the top portions 15 opposite to the supporting wall 13 of the one of the top portions 15 comprises a first fixing portion 131.

The cover 20 is located on the supporting walls 13 and received in the hollow area 16 to cover the hollow frame 10. The cover 20 comprises a first end 24 and a second end 25 opposite to the first end 24. A first latch 22 is located on the first end 24 and corresponds to the first groove 132, and a second fixing portion 23 located on the second end 25 corresponds to the first fixing portion 131. In assembly, the first latch 22 engages with the first groove 132, and the second fixing portion 23 engages with the first fixing portion 131, such that the cover 20 is fixed to the hollow frame 10.

Figure 3:
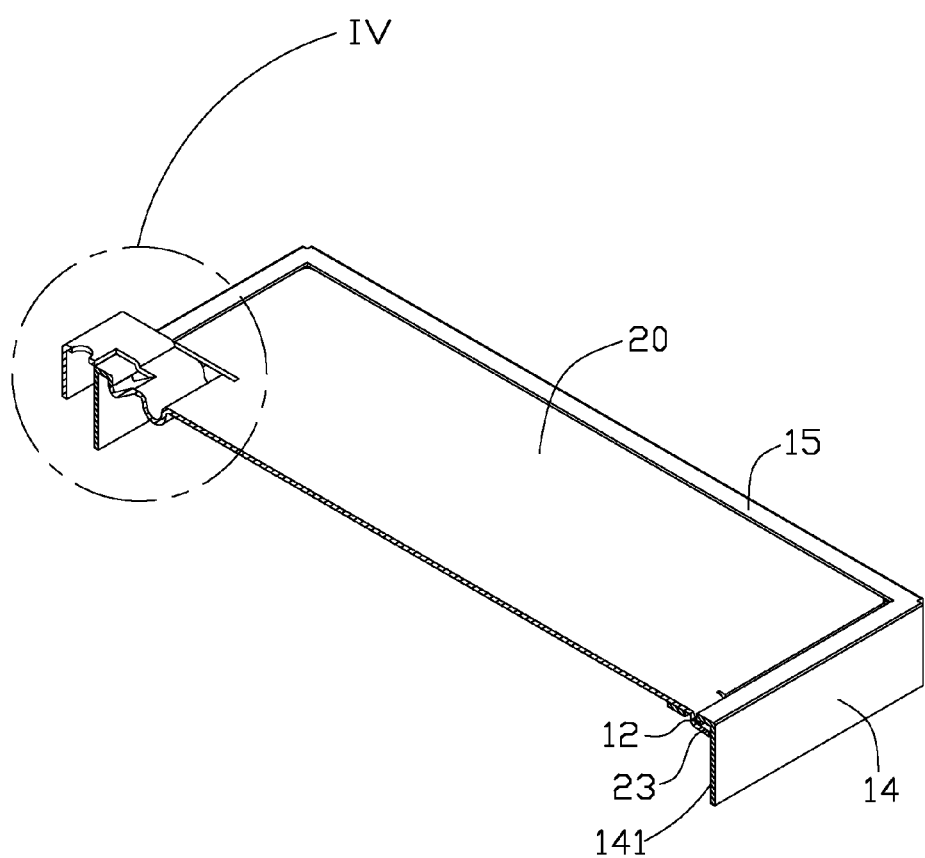
FIG. 3 is a cross sectional view taken along line III-III of FIG. 1.
Figure 4:
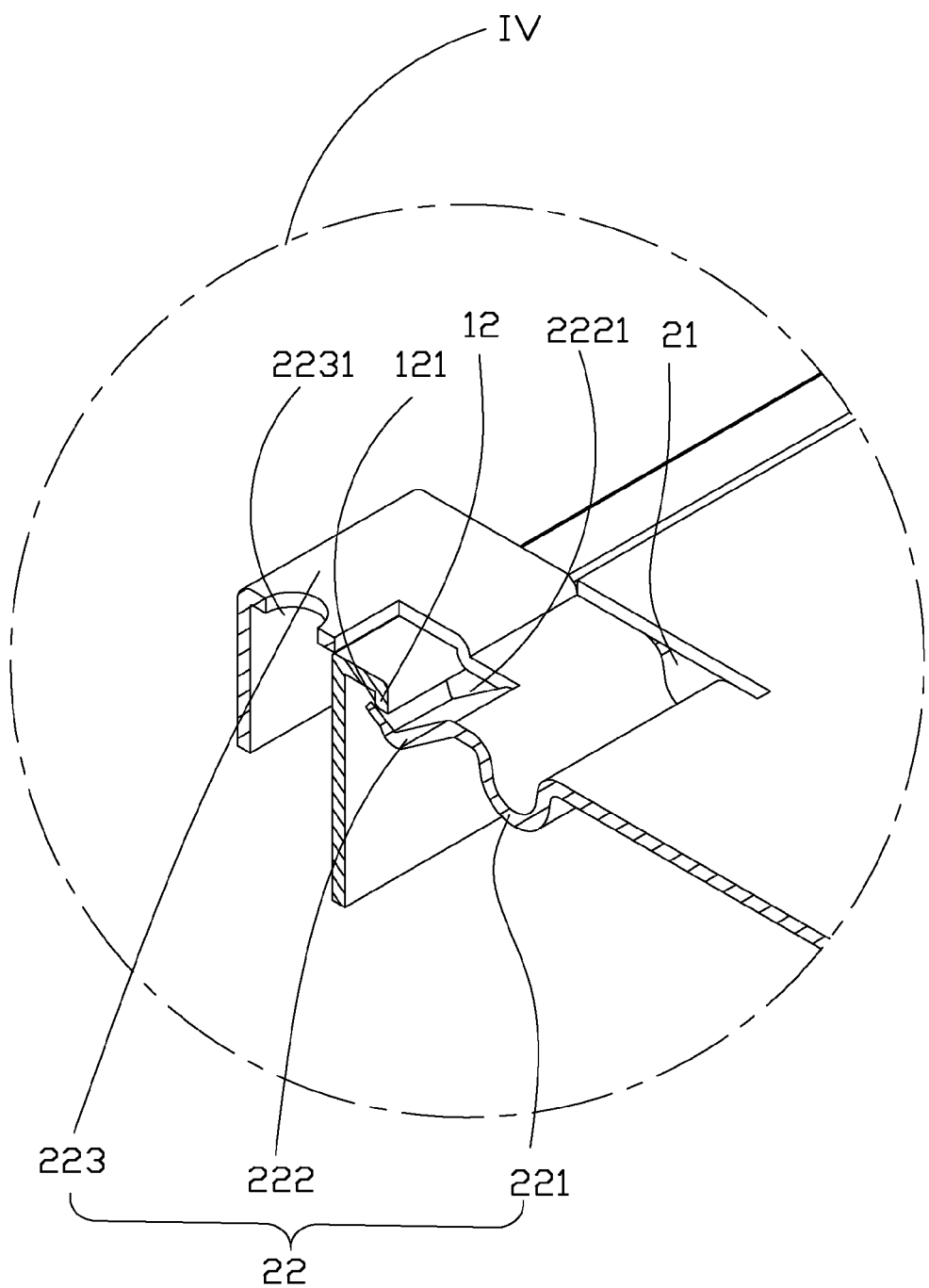
FIG. 4 is an enlarged sectional view of FIG. 3.

With reference to FIG. 3 and FIG. 4, the first latch 22 comprises a resilient bent portion 221 extending from the first end 24, a hook 222 protruding from the resilient bent portion 221, and a trigger portion 223 extending from the resilient bent portion 221. In assembly, the hook 222 intersects with the first groove 132 and resists on an inner surface 121 of a corresponding resisting wall 12. In the embodiment, the hook 222 is formed by punching and bending a portion of the first resilient bent portion 221, such that two first gaps 2221 are defined on two sides of the hook 222, respectively. In the embodiment, the trigger portion 223 further defines a hole 2231, where when removing the cover 20 from the hollow frame 10, an operator can insert an auxiliary tool into the hole 2231 to release the cover 20.

In the embodiment, the first latch 22 is formed by cutting a portion of the first end 24 of the cover 20, such that two second gaps 21 are defined on two sides of the first latch 22, respectively. The first resilient portion 221 is formed by bending the cut portion of the cover 20.

In the embodiment, the first fixing portion 131 is a latch hole, and the second fixing portion 23 is a tongue extending from the second end 25 of the cover 20. In assembly, the tongue 23 is received in the latch hole 131 and resists on an inner surface 141 of a corresponding sidewall 14 of the hollow frame 10.

During assembly of the shielding assembly 100, the tongue 23 is first inserted into the latch hole 131 and resists on the inner surface 141 of the corresponding sidewall 14 to retain the second end 25 of the cover 20 on the hollow frame 10. Then, the first resilient portion 221 is compressed by forces operated on the trigger portion 223 so that the hook 222 is able to be put in the first groove 132 and abut against the inner surface 121 of the corresponding resisting wall 12, so as to retain the first end 24 of the cover 20 onto the hollow frame 10. In this position, the cover 20 is firmly fixed on the hollow frame 10.

When detaching the cover 20 from the hollow frame 10, the trigger portion 223 is pressed towards the hollow area 16 of the hollow frame 10 by an external force, consequently the hook 222 moves from the first groove 132 under elastic deformability of the resilient bent portion 221 of the first latch 22. In this position, the first end 24 of the cover 20 is detached from the hollow frame 10 and the cover 20 is released from the hollow frame 10.

Figure 5:
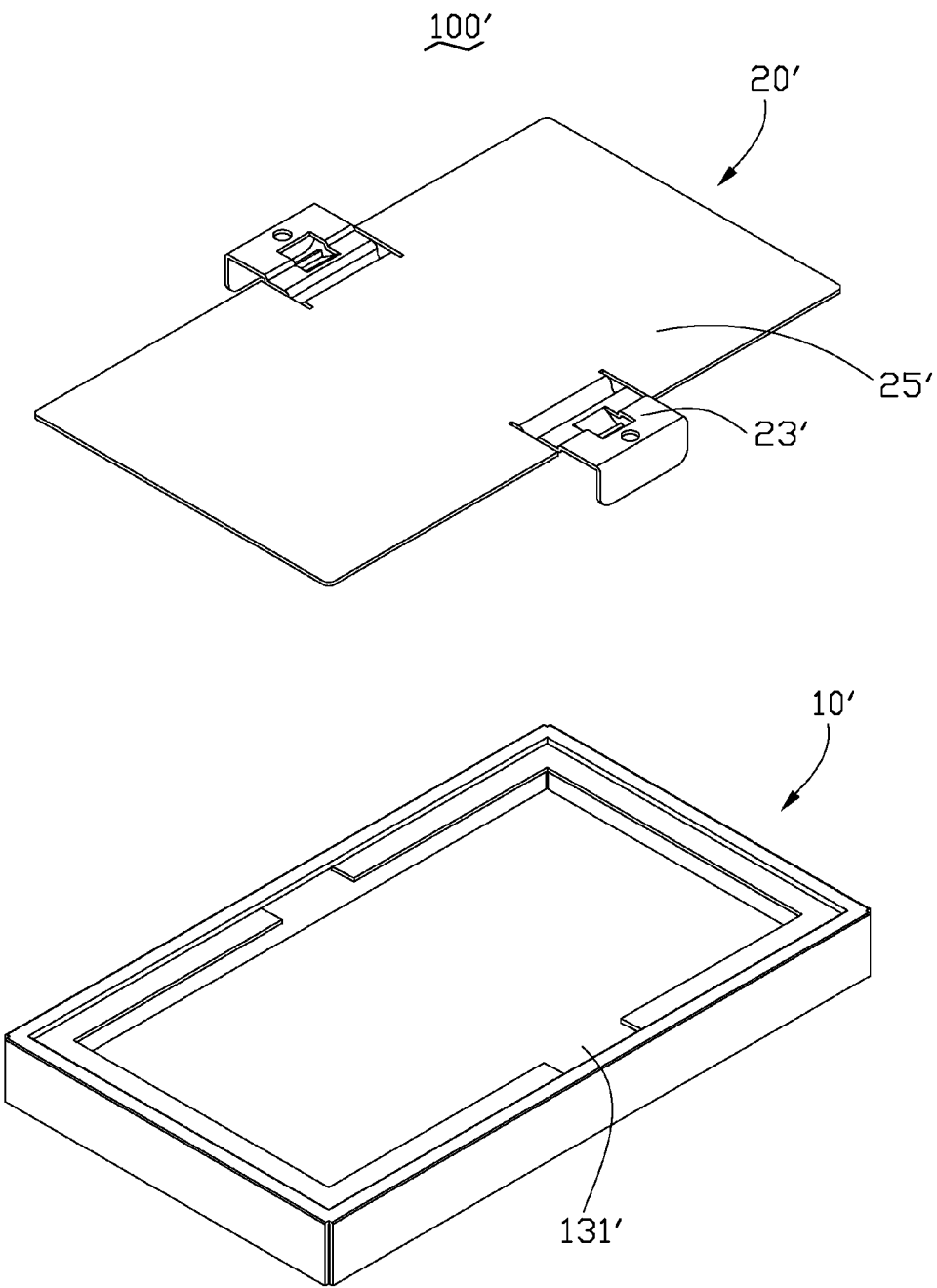
FIG. 5 is an exploded view of a shielding assembly in accordance with a second embodiment of the disclosure.

FIG. 5 is a perspective, isometric view of a shielding assembly 100' in accordance with a second embodiment of the disclosure. The shielding assembly 100' has the same configuration and can perform the same function as the shielding assembly 100 shown in FIG. 1, differing in that a hollow frame 10' defines a second groove 131', and a cover 20' comprises a second latch 23' located on a second end 25' of the cover 20' and engaged with the second groove 131' to retain the second end 25' of the cover 20' on the hollow frame 10'. In the embodiment, the second latch 23' has the same structure of the first latch 22 of the shielding assembly 100 of FIG. 1.

While the exemplary embodiments have been described, it should be understood that it has been presented by way of example only and not by way of limitation. The breadth and scope of the disclosure should not be limited by the described exemplary embodiments, but only in accordance with the following claims and their equivalents.

What is claimed is:

1. A shielding assembly, comprising:
    a hollow frame comprising a plurality of sidewalls and a plurality of top portions respectively perpendicularly extending from the sidewalls, the sidewalls and the top portions collectively defining a hollow area, each top portion comprising a top wall extending from edge of a corresponding sidewall and towards the hollow area, a resisting wall extending perpendicularly from the top wall, and a supporting wall extending perpendicularly from the resisting wall and towards the hollow area of the hollow frame, one of the supporting walls defining a first groove, and another one of the supporting walls opposite to the one of the supporting walls comprising a first fixing portion;
    a cover located on the supporting portions to cover the hollow frame, the cover comprising a first end, a second end opposite to the first end, a first latch located on the first end and corresponding to the first groove, and a second fixing portion located on the second end and corresponding to the first fixing portion, the first latch comprising a resilient bent portion extending from the first end of the cover, and a hook protruding from the resilient bent portion;
    wherein the hook interferes with the first groove and abuts against on an inner surface of a corresponding one of the resisting walls, and the second fixing portion engages with the first fixing portion, so as to retain the cover on the hollow frame, when the resilient bent portion is pressed towards the hollow area of the hollow frame, the hook is moved from the first groove by elastic deformability of the resilient bent portion, such that the cover is released from the hollow frame.

2. The shielding assembly as claimed in claim 1, wherein the first latch further comprises a trigger portion extending from the resilient bent portion.

3. The shielding assembly as claimed in claim 2, the trigger portion defines a hole.

4. The shielding assembly as claimed in claim 3, wherein the first fixing portion defines a second groove, and the second fixing portion comprises a second latch engaged with the second groove.

5. The shielding assembly as claimed in claim 4, wherein the second latch has the same structure of the first latch.

6. The shielding assembly as claimed in claim 1, wherein two gaps are defined on two sides of the hook, respectively.

7. The shielding assembly as claimed in claim 1, wherein the first fixing portion is a latch hole, and the second fixing portion is a tongue extending from the second end of the cover and received in the latch hole.

* * * * *